United States Patent
Bethurum

[11] Patent Number: 5,993,248
[45] Date of Patent: Nov. 30, 1999

[54] BATTERY CONNECTOR

[75] Inventor: Gary Cain Bethurum, Laguna Niguel, Calif.

[73] Assignee: ITT Manufacturing Enterprises, Inc., Wilmington, Del.

[21] Appl. No.: 08/975,132

[22] Filed: Nov. 20, 1997

[51] Int. Cl.[6] .................................................. H01R 3/00
[52] U.S. Cl. .............................................. 439/500; 439/77
[58] Field of Search ................................ 439/500, 67, 77, 439/492, 627; 429/96, 97, 98, 99, 100

[56] References Cited

U.S. PATENT DOCUMENTS

| | | | |
|---|---|---|---|
| 4,893,001 | 1/1990 | Ohkubo et al. | 235/490 |
| 5,151,774 | 9/1992 | Mori et al. | 357/79 |
| 5,157,244 | 10/1992 | Mroczkowski et al. | 235/441 |
| 5,299,955 | 4/1994 | Maeda et al. | 439/500 |
| 5,529,503 | 6/1996 | Kerklaan | 439/76.1 |
| 5,575,682 | 11/1996 | Alexander | 439/500 |
| 5,590,028 | 12/1996 | Duncan | 361/737 |

*Primary Examiner*—Gary F. Paumen
*Attorney, Agent, or Firm*—Thomas L. Peterson

[57] ABSTRACT

A connector is disclosed for a battery having upper and lower terminals. The connector is in the form of a flexible circuit that is bent around one side of the battery, and includes an upper section overlying the upper terminal of the battery and a lower section below the lower terminal of the battery. The upper and lower sections of the flexible circuit have conductors thereon that engage the battery terminals. The conductors extend to a connecting section of the flexible circuit to make electrical contact with the conductors of an electronic component.

25 Claims, 9 Drawing Sheets

BATTERY CONNECTOR

BACKGROUND OF THE INVENTION

The present invention relates generally to an electrical connector and, more particularly, to an electrical connector for use with a battery having upper and lower terminals.

Batteries are in common use in portable and small electrical apparatus, such as calculators, clocks, wristwatches, hearing aids, IC cards, car alarm activators, etc., to provide an electric current to electronic components mounted therein, such as a circuit board, LED, or other electronic devices. Typically, the electrical connection between the battery and the electronic component is made by a pair of stamped and formed metal contacts. The two contacts often have a different configuration, and the assembly of the two parts into the apparatus housing increases the cost of the apparatus. Furthermore, frequently due to the configuration of the contacts, the battery connector has a higher profile than is desired for some applications.

It is an object of the present invention to provide a simple, low cost, low profile battery connector.

It is another object of the invention to provide such a battery connector that is integrated with an input/output connector for use with an IC card.

SUMMARY OF THE INVENTION

According to a principal aspect of the present invention, there is provided a battery connector member that provides electrical connection between the upper and lower terminals of a battery and an electronic component. The connector element is in the form of a flexible circuit that is bent around the side of the battery, and includes an upper section overlying the upper terminal of the battery and a parallel lower section below the lower terminal of the battery. A first conductor is provided on the flexible circuit having one end at the lower section exposed to make electrical contact with the lower terminal of the battery, and a second end exposed at a connecting section of the flexible circuit for making electrical connection to a first conductor of the electronic component in the electrical apparatus in which the battery and battery connector element are mounted. A second conductor is provided on the flexible circuit having one end at the upper section exposed to make electrical contact with the upper battery terminal, and a second end exposed at the connecting section for making electrical connection to a second conductor of the electronic component. The second conductor passes through the bent section of the flexible circuit. By this arrangement, there is provided an integral, one-piece connector element which is simple, low cost, and when folded around the battery has a very low profile. The battery connector element of the invention avoids the need for two separate stamped and formed contacts, and the assembly of two parts to a housing.

The invention will be best understood from the following description when read in conjunction with the accompanying drawings.

DESCRIPTION OF THE PREFERRED EMBODIMENTS

Figure 1:
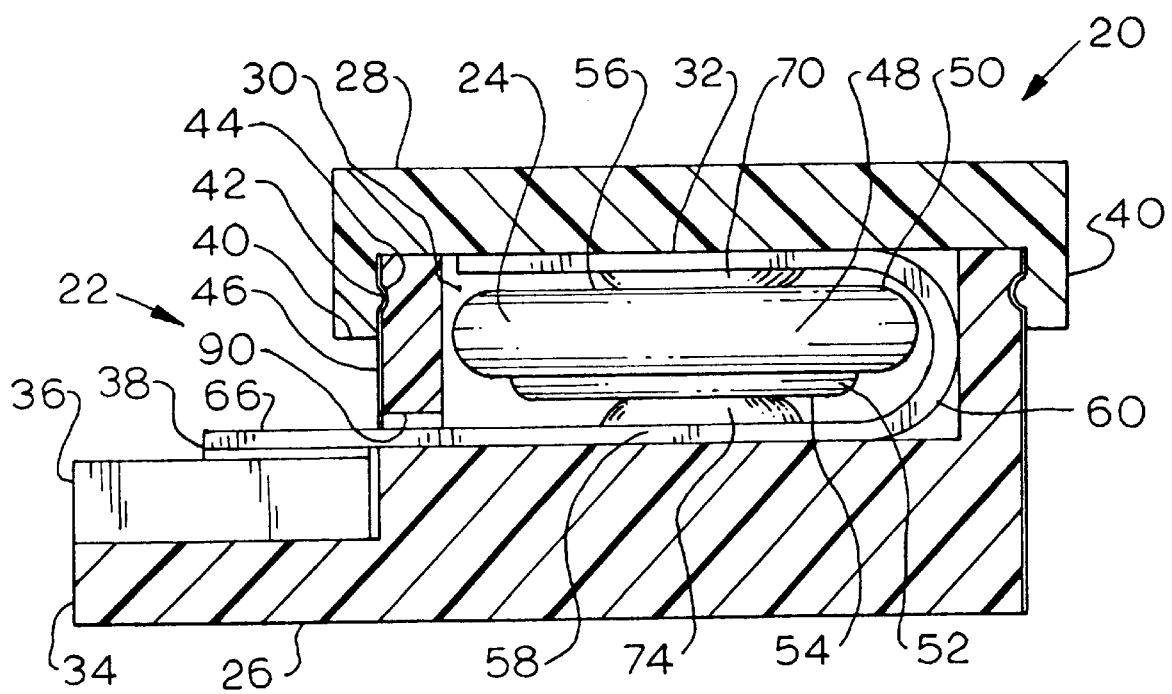
FIG. 1 is a greatly enlarged, partial vertical sectional view through a simplified form of the battery connector of the present invention with a battery mounted therein.

Referring now to the drawings in detail, there is shown in FIGS. 1–4 a somewhat simplified version of the battery connector of the present invention, generally designated 20. The battery connector comprises a housing 22 that holds a battery 24, which may be in the form of a relatively flat, circular, button-type battery, although the present invention may be utilized with batteries of other configuration, provided that the batteries have terminals at their upper and lower ends.

The housing 22 comprises a base 26 and a cover 28. A generally circular recess 30 is formed in the base for holding the battery connector member 32 of the invention, together with battery 20. The base 26 includes a support 34 on which there is mounted an electronic component 36, which is normally a circuit board, but could also be an LED or other electronic device. The electronic component 36 has two conductors 38 on its upper surface, only one of such conductors being shown in FIG. 1. If the component 36 is a circuit board, the conductors 38 would be conductive traces on the upper surface of the board that lead to electronic devices mounted on the board.

The cover 28 has downwardly-extending flanges 40 on its opposite sides, each formed with an inwardly-extending projection 42 that fits within a recess 44 on the outside of the wall 46 of the base to provide a releasable detent-type mounting connection between the cover and the base.

The battery 24 has an upper terminal 48 providing an upwardly-facing contacting surface 50, and has a lower terminal 52 providing a downwardly-facing contacting surface 54. The upper terminal 48 may be the negative terminal, and the lower terminal 52 may be the positive terminal of the battery, although the polarities of the battery may be reversed.

Figure 2:
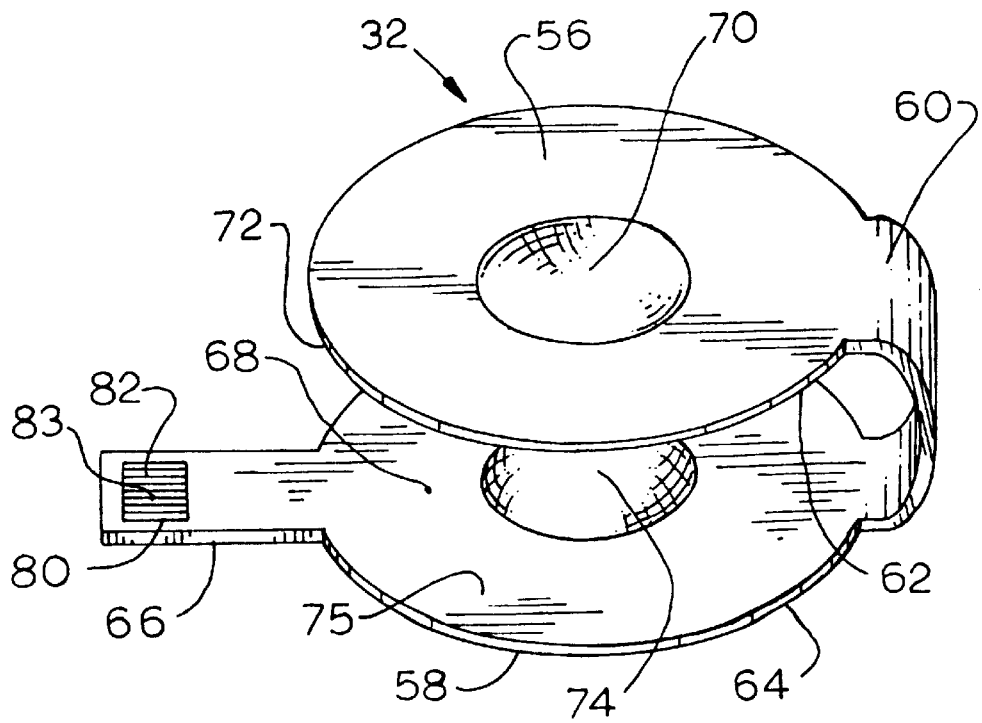
FIG. 2 is an isometric view of the flexible circuit battery connector member utilized in the battery connector illustrated in FIG. 1.

Reference is now made to FIG. 2 which best illustrates the battery connector member 32 of the present invention which is in the form of a U-shaped flexible circuit that, as seen in FIG. 1, is bent around one side of the battery 24. The connector member 32 has a circular upper section 56 and a circular lower section 58 that is generally parallel to the upper section and spaced from the upper section a distance corresponding generally to the distance between the battery-contacting surfaces 50 and 54. The diameter of the circular upper and lower sections 56 and 58, respectively, correspond generally to the diameter of the battery 24.

The flexible circuit connector member 32 includes a bent interconnecting section 60 that is joined to the edges 62 and 64 of the upper section 56 and lower section 58. The height of the bent section 60 is slightly greater than the height of the battery 24.

On the side of the lower section 58 of the connector member 32 generally diametrically opposed to the bent section 60 there is provided a connecting section 66 that extends laterally outwardly from the edge 64 of the lower section. The connecting section 66 embodies exposed flexible circuit conductors for making electrical connection to the conductors 38 on electronic component 36, as will be described in further detail below.

The spaced-apart parallel sections 56 and 58 of the connector member 32 define a space 68 therebetween that receives the battery 24. A resilient conductive dimple 70 extends downwardly from the lower surface 72 of the upper section 56 of the connector member generally at the center of the circular upper section, while a resilient conductive dimple 74 projects upwardly from the upper surface 76 of the lower section 58 of the connector member, likewise located at generally the center of the circular lower section, whereby the dimples 70 and 74 are generally vertically aligned with each other and face toward each other. The conductive dimples 70 and 74 are exposed to make electrical contact with the upwardly-facing contacting surface 50 of the upper terminal 48 of the battery, and with the downwardly-facing contacting surface 54 of the lower terminal 52 of the battery, respectively. Since the dimples are hollow, they may be resiliently deformed when a vertically-directed compressive force is applied to the upper and lower sections 56, 58 of the connector member 32.

The height of the wall 46 of the base 26 of the connector housing 22 that forms the recess 30 is slightly less than the height of the battery 24 and the upper and lower sections 56, 58 of the connector member 32 when the cover 28 is removed from the base 26. When the cover 28 is mounted onto the base 26, a vertical compressive force is applied to the upper and lower sections of the connector member causing the dimples 70 and 74 to resiliently deform, which results in a firm electrical contact being made between the dimples and the terminals of the battery.

Figure 3:
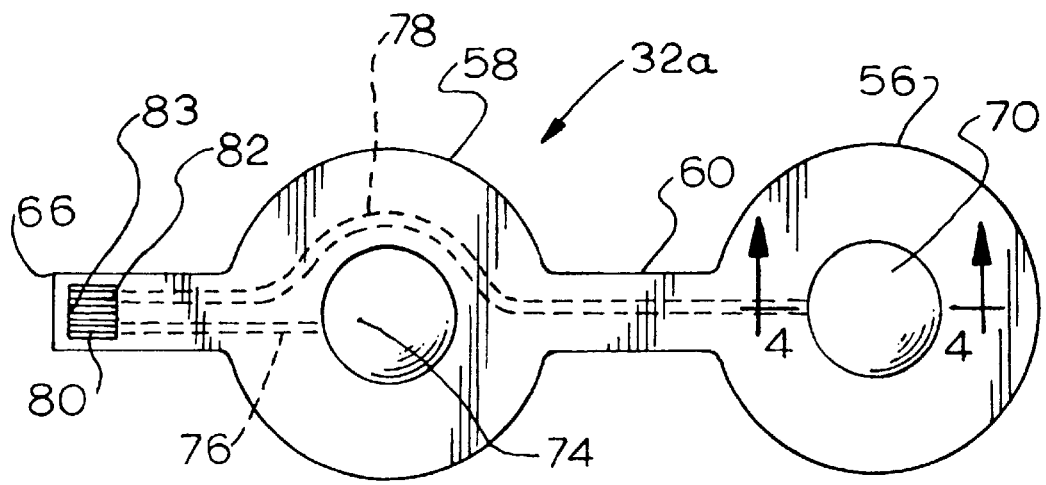
FIG. 3 is a plan view of the flexible circuit blank from which the battery connector element shown in FIG. 2 is formed.

Reference is now made to FIG. 3 which shows the flexible circuit blank 32a from which the battery connector member 32 shown in FIGS. 1 and 2 is formed.

The flexible circuit blank contains two conductors 76 and 78, the conductors being shown in phantom in FIG. 3 except for exposed ends 80 and 82 in the connecting section 66 of the connector member. The conductors are typically metal strips. The ends 80 and 82 of the conductors are exposed by cutting windows 83 in the upper and lower plastic sheets of the flexible circuit. The spacing of the exposed conductor ends 80 and 82 corresponds to the lateral spacing of the conductors 38 on the upper surface of the electronic component 36 shown in FIG. 1.

The conductor 80 extends to the center of the lower section 58 of the connector member where it is deformed to form the dimple 74. The second conductor 78 extends through the lower section 58, the interconnecting section 60 to the center of the upper section 56 where it is deformed to form the dimple 70. In the blank form of the flexible circuit illustrated in FIG. 3, the dimples 70 and 74 project upwardly.

Preferably, the width of the interconnecting section 60 and the width of the connecting section 66 of the flexible circuit is less than one-half the radius of the circular sections 56 and 58.

Figure 11:
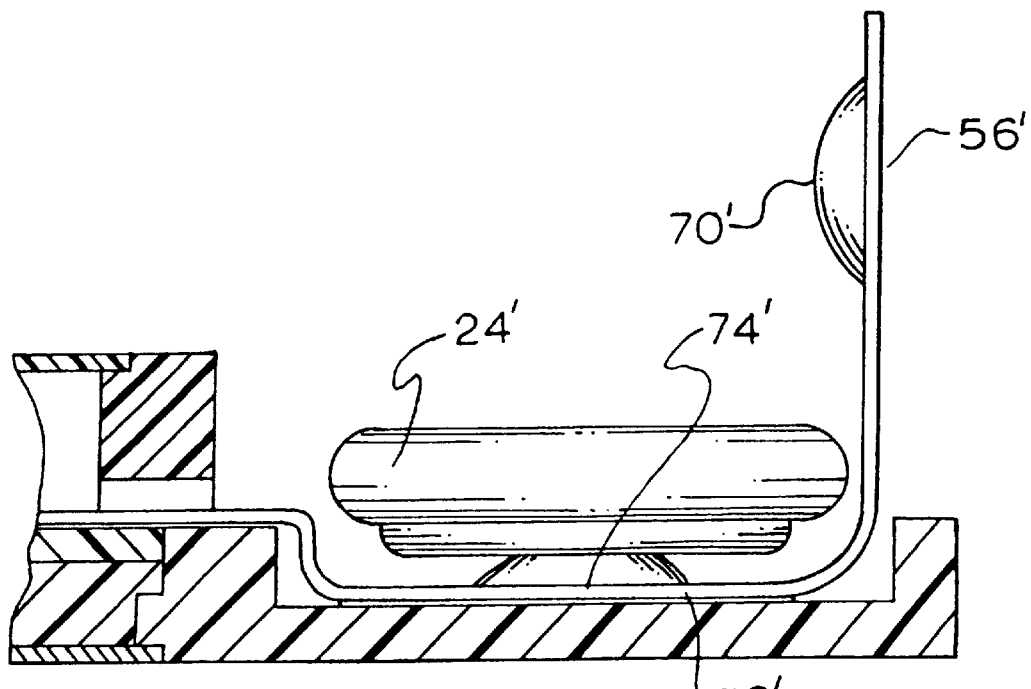
FIG. 11 is a vertical sectional view similar to FIG. 10, with the battery cover removed and the upper section of the flexible circuit connector element pivoted upwardly to allow the battery to be installed or withdrawn from the connector.

The flexible circuit blank 32a is formed into U-shape, as illustrated in FIGS. 1 and 2, with the bend occurring in the interconnecting section 60 of the flexible circuit. When installing the battery connector member 32 into the recess 30 in the base 26 of the connector housing, the connecting section 66 of the connector member is passed through a slot 90 in the wall 46 of the base to position the exposed ends 80 and 82 of the conductors 76 and 78 over the terminals 38 of the electronic component 36, whereby the conductors of the connector member and the component may be electrically joined by soldering, or by the use of a conductive adhesive. To install the battery in the connector, the upper section 56 of the connector member 32 is raised or pivoted about the region of the bent section 60, as seen in FIG. 11, to permit the battery to be placed on the top of the lower section 58 of the connector member. Thereafter, the upper section is pushed down to a position parallel with the lower section, and the cover 28 is mounted onto the base 26 of the connector housing, which causes the exposed conductive dimples 70 and 74 to be resiliently deformed to provide a good electrical engagement between the conductors of the connector member and the battery terminals.

Figure 4:
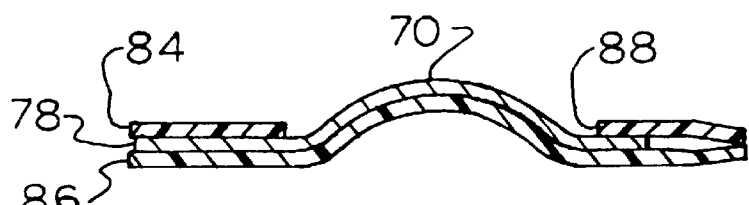
FIG. 4 is an enlarged sectional view taken along line 4—4 of FIG. 3 showing a dimple on the flexible circuit that makes contact with the terminal of a battery.

Reference is now made to FIG. 4 that shows how one of the exposed dimples (70) is formed from the flexible circuit that forms the battery connector member 32. The flexible circuit is preferably a single conductor layer flexible circuit having upper and lower plastic sheets 84, 86 with a single layer conductor 78 disposed therebetween. The conductor 78 terminates in an enlarged circular section that is exposed by cutting a circular hole 88 in the upper plastic sheet 84. The dimple 70 is formed into an upwardly-projecting, hollow resilient portion by applying a force, by the use of a suitable rounded tool, to the bottom of the flexible circuit. The plastic sheets 84 and 86 may be formed of a suitable polymer film, such as Mylar, while the conductors 76 and 78 of the flexible circuit are typically thin metal strips formed of copper. The dimple 74 in the lower section 58 of the connector member 32 is formed in the same manner as is the dimple 70.

The dimples 70 and 74 preferably have a semi-hemispherical configuration. However, if desired, the dimples could be simply upwardly raised, curved sections in the metal strips that form the conductors, rather than using enlarged circular dimples as shown in FIGS. 2 and 4, particularly if the battery is relatively large. Also, the circuit that forms the battery connector member 32 may not necessarily be a flexible circuit, provided that the interconnecting section 60 is flexible so that the connector member may be bent around a battery. For example, the lower plastic sheet of the flexible circuit could be somewhat rigid, except in the interconnecting section area 60, and the upper plastic sheet 84 could be eliminated so that the lower sheet in effect forms a substrate for the conductors 76 and 78.

From the foregoing, it can be appreciated that by the use of the battery connector member 32 of the present invention, there is provided a simple, low cost, low profile product which avoids the need for separate stamped metal contacts that must be assembled separately in the connector body as in conventional battery connectors. The use of a one-piece flexible circuit is particularly advantageous in that it provides an integral connector element that can be readily mounted in a connector body for connecting the terminals of a battery to an electronic component.

Reference is now made to FIGS. 5–13 that illustrate an IC card incorporating a modified form of the battery connector of the present invention. The IC card is generally designated by reference numeral 100. In describing the battery connector of the IC card, the parts thereof that are identical to or correspond to the parts in the battery connector 20 illustrated in FIGS. 1–4 have been given identical reference numerals differentiated by prime marks.

The IC card 100 is adapted for insertion into a slot in the side of a lap top or portable computer for mating with the host connector in the computer. The IC card may be a memory card, a PC card, such as a fax/modem or LAN card, etc.

Figure 5:
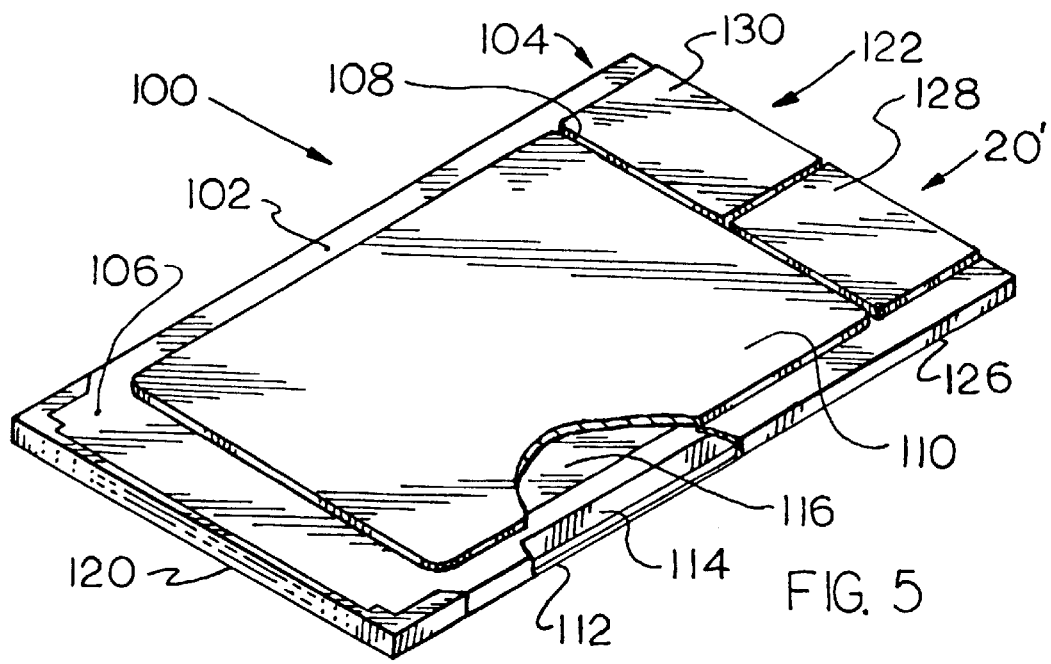
FIG. 5 is an isometric view of an IC card viewed from the front thereof, which incorporates a combined integral battery-I/O (input/output) connector element, with a portion of the upper metal cover of the IC card removed to show interior features thereof.

Referring to FIG. 5, the IC card 100 includes an enclosure 102 and a rear connector assembly 104. The enclosure has a front end 106 and a rear end 108. The enclosure 102 comprises a top metal cover 110 and a lower metal cover 112. Typically, a rectangular plastic frame 114 is mounted in the enclosure 102 for supporting a circuit board 116 on which there are mounted electronic devices, not shown. An electrical connector 120 is mounted at the front end of the enclosure 102. This connector is adapted to mate with a host connector in the computer when the IC card is mounted through the slot in the side of the computer. The parts of the IC card described so far are conventional.

The rear connector assembly 104 extends rearwardly from the rear 108 of the enclosure 102 of the IC card. The connector assembly 104 embodies a battery connector 20' and an I/O connector 122 that incorporate a combined integral battery-I/O connector element 124 of the present invention, best seen in FIG. 8.

Figure 6:
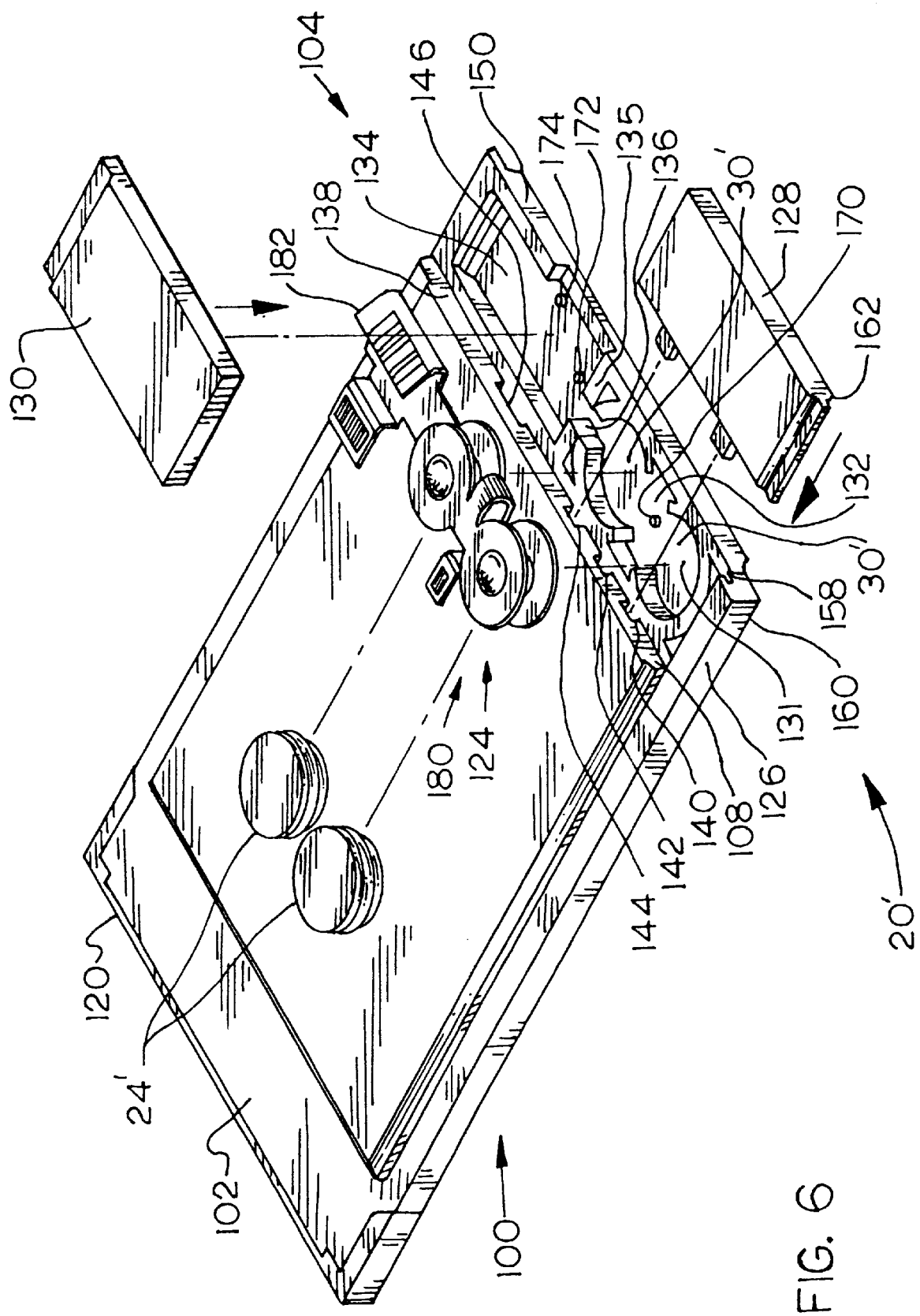
FIG. 6 is an isometric view of the IC card illustrated in FIG. 5 viewed from the rear thereof, with the rear part of the card shown in exploded view.
Figure 7:
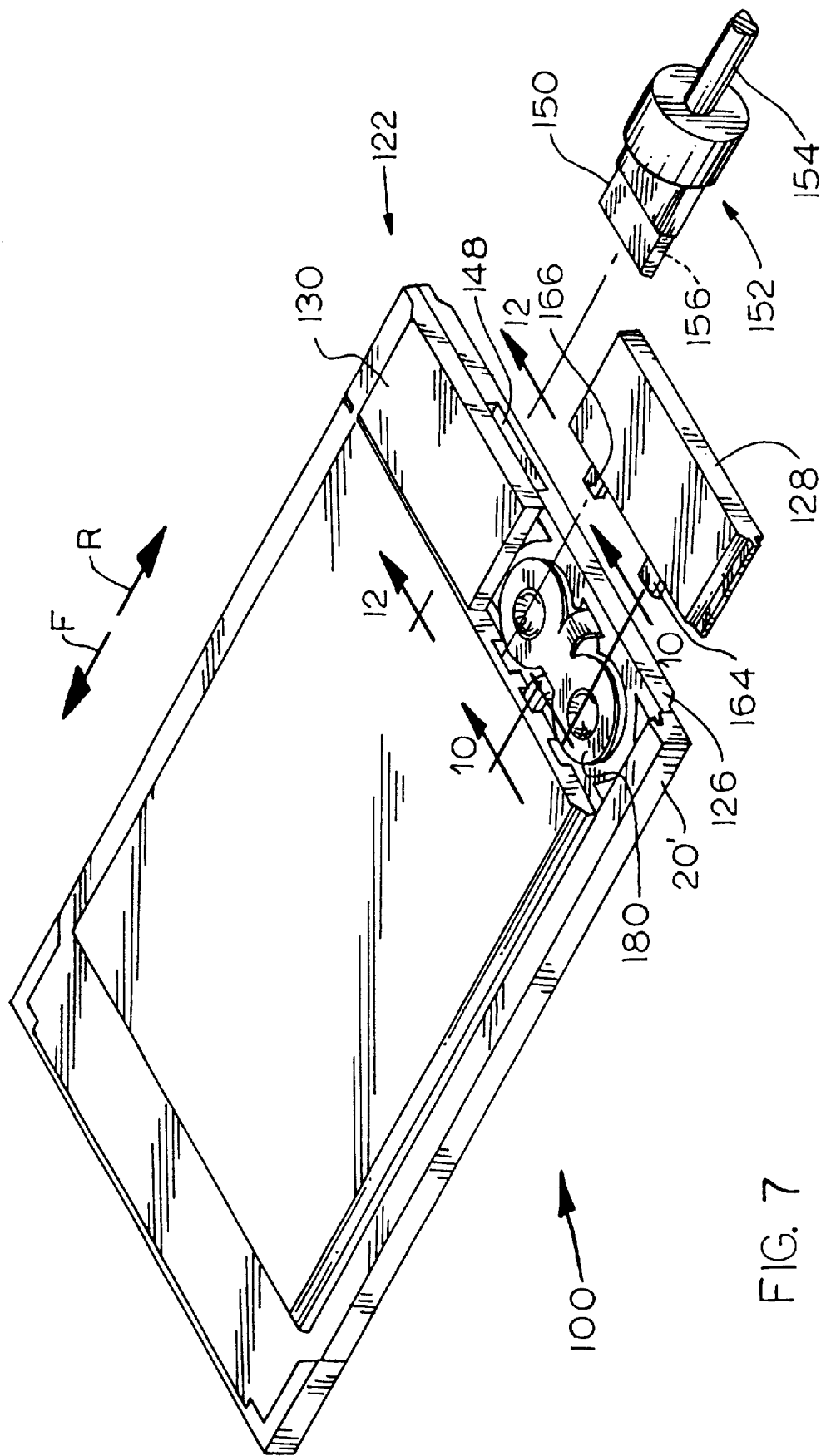
FIG. 7 is an isometric view similar to FIG. 6 showing all the parts of the rear portion of the IC card assembled, except for the battery cover, and also showing a plug connector that is mateable with the I/O connector section of the combined battery-I/O connector element.
Figure 10:
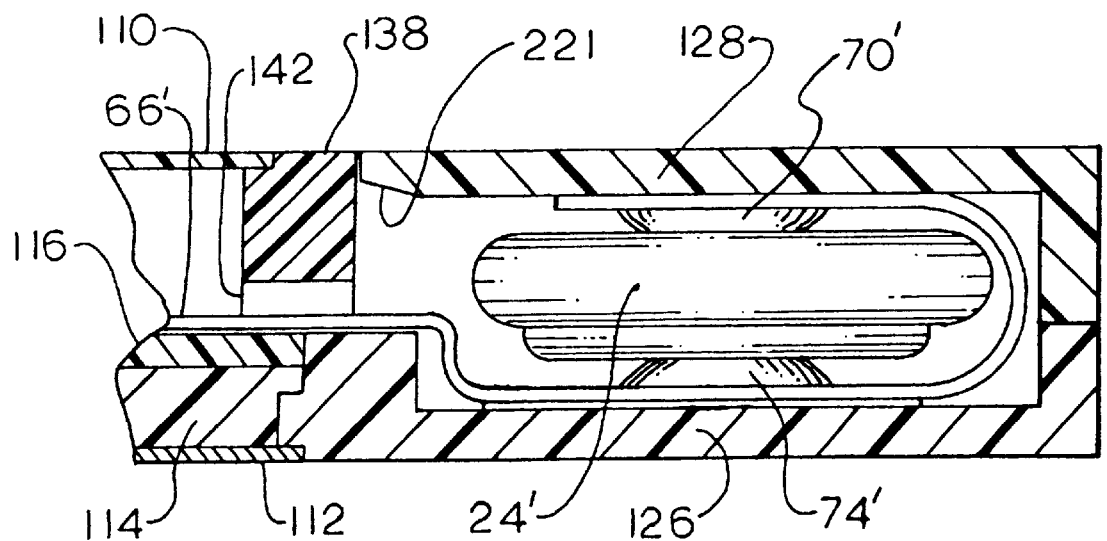
FIG. 10 is an enlarged partial vertical sectional view taken through line 10—10 of FIG. 7, with the battery cover installed over the batteries.

As seen in FIGS. 6 and 7, the rear connector assembly 104 of the IC card 100 has an elongated, generally flat housing comprising a common base 126, a battery cover 128, and a connector cover 130. The cover 130 may be retained on the base 126 by sonic welding, adhesive, etc. The base 126 may be an integral extension of the plastic frame 114 in the IC card enclosure 102, or a separate part fixed to the frame, as shown in FIG. 10.

The base 126 is formed with a profiled cavity 131 comprising two circular recesses 30' interconnected by a slot 132. The base also includes a rectangular cavity 134 which is separated from the cavity 131 by an upstanding wall 135 that has a narrow slot 136 therein. The base 126 includes at its forward end an upstanding flange 138. Slots 140, 142, and 144 extend through the flange into the interior of the IC card enclosure 102. The slots 140 and 144 are generally aligned with the centers of the recesses 30', while the slot 142 is aligned with the slot 132. An additional slot 146 is formed in the flange 138 in front of the cavity 134. The slot 146 also opens into the interior of the enclosure 102. A notch 148 is formed in the rear wall 150 of the base 126 generally aligned with the slot 146. When the cover 130 is mounted over the cavity 132 onto the base 126, the notch 148 forms a slot, or I/O port, for receiving the front end 150 of a plug connector 152 connected to a cable 154. The front end 150 of the plug connector may be in the form of a printed circuit board having conductive traces 156 on its bottom surface which are electrically connected to the conductors in the cable 154.

A keyway 158 is formed in the inside surface of a side wall 160 of the base 126. The battery cover 128 is formed with an elongated key 162 on one side that has a sliding fit within the keyway 158 when the battery cover is slid forwardly over the recesses 30' in the base 126. The battery cover embodies two forwardly-extending projections 164 and 166 that are spaced apart a distance corresponding to the spacing between the slots 140 and 144 in the flange 138 of the base 126. The projections 164 and 166 are dimensioned to have a frictional fit within the slots 140 and 144 in the flange so that when the battery cover is slid forwardly to its forward-most position on the base the projections will project into said slots to retain the cover on the base.

Upstanding pins 170, 172, and 174 are formed in the bottom of the base 126 to fit into holes, to be described later herein, in the combined battery-I/O connector element 124 to precisely locate the element in the base.

Figure 8:
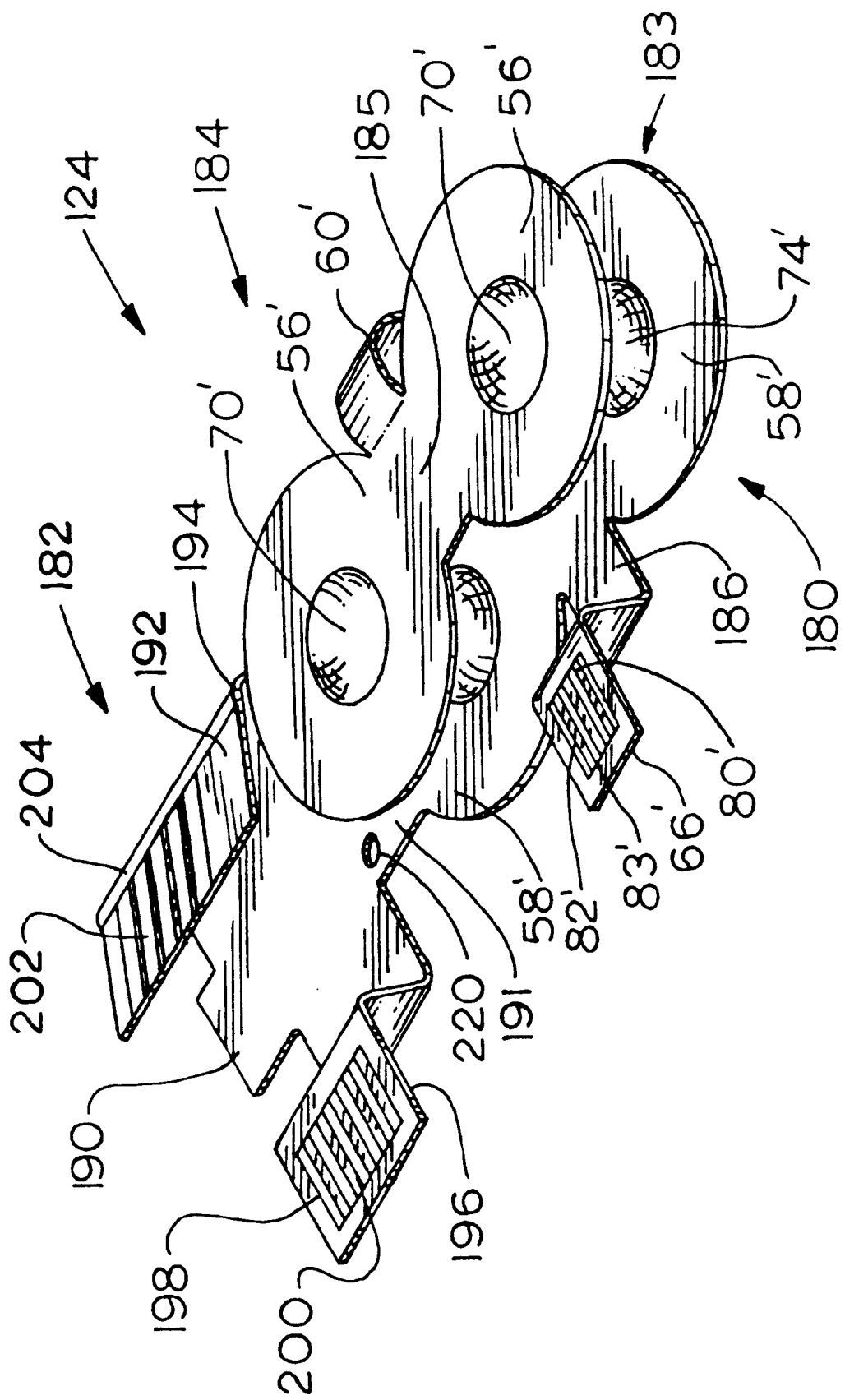
FIG. 8 is an enlarged isometric view showing the combined battery-I/O connector element of the invention.

As best seen in FIG. 8, the battery-I/O connector element 124 includes a dual battery connector member 180 and an I/O connector member 182 that are formed out of a single flexible circuit providing a one-piece integral connector element. The battery connector member 180 includes a first set 183 of upper and lower parallel sections 56' and 58', and a second set 184 of upper and lower parallel sections 56' and 58'. The upper and lower sections 56' and 58' are identical to those described in connection with the battery connector member 32 illustrated in FIGS. 1–4. The two upper sections 56' are joined by an interconnecting part 185, while the lower sections 58' are joined by an interconnecting part 186. The bent section 60' of the connector member is joined to the edges of the interconnecting parts 185 and 186. The connecting section 66' is joined to the edge of the interconnecting part 186 and extends laterally outwardly therefrom in a direction opposite to, but aligned with, the bent section 60'. The connecting section 66' has windows 83' formed in the upper and lower sheets of the flexible circuit to expose conductors 80' and 82'. The connecting section 66' is dimensioned to have a sliding fit through the slot 142 in the flange 138 in the connector base 126 shown in FIGS. 6 and 7.

The two sets 183 and 184 of upper and lower parallel sections of the battery connector member are formed with dimples 70' and 74' which may be the same as the dimples 70 and 74 incorporated in the battery connector member 32. The dimples are positioned to engage the upper and lower terminals 48', 52' of two batteries 24' mounted between the two sets of upper and lower sections 56' and 58' of the battery connector member 124.

The I/O connector member 182 of the connector element 124 is an integral extension of that portion of the flexible circuit that forms the battery connector member 180. The extension includes a flat lower portion 190 and angular upper portion 192. The flat lower portion 190 of the extension is connected to the lower section 58' of the second set 184 of parallel sections of the battery connector member 180 by a laterally-extending interconnecting part 191. The interconnecting part is dimensioned to fit within the slot 136 in the wall 135 of the connector base 126. The angular upper portion 192 extends upwardly and rearwardly from a bend 194 in the flexible circuit. A connecting section 196, which is similar to the connecting section 66' of the battery connector member 180, extends laterally outwardly from the flat lower portion 190 of the flexible circuit in a direction opposite to the bend 194. The connecting section has a window 198 extending therethrough in which there are exposed a plurality of conductors 200, five being shown by way of example only. The opposite ends 202 of the conductors are exposed on the upper surface of the angular upper portion 192 of the I/O connector member by removing the upwardly-facing plastic sheet of the flexible circuit at the point of the strip line 204 shown in FIG. 8. The connecting section 196 is dimensioned to have a sliding fit through the slot 146 in the flange 138 of the connector base 126.

The first and second sets 183 and 184 of the parallel sections of the battery connector member 180 are configured to have a sliding fit within the profiled cavity 131 in the base 126 of the rear connector assembly 122 illustrated in FIG. 6, and the lower flat portion 190 of the I/O connector member is configured to have a sliding fit within the rectangular cavity 134 in the base.

Figure 9A:
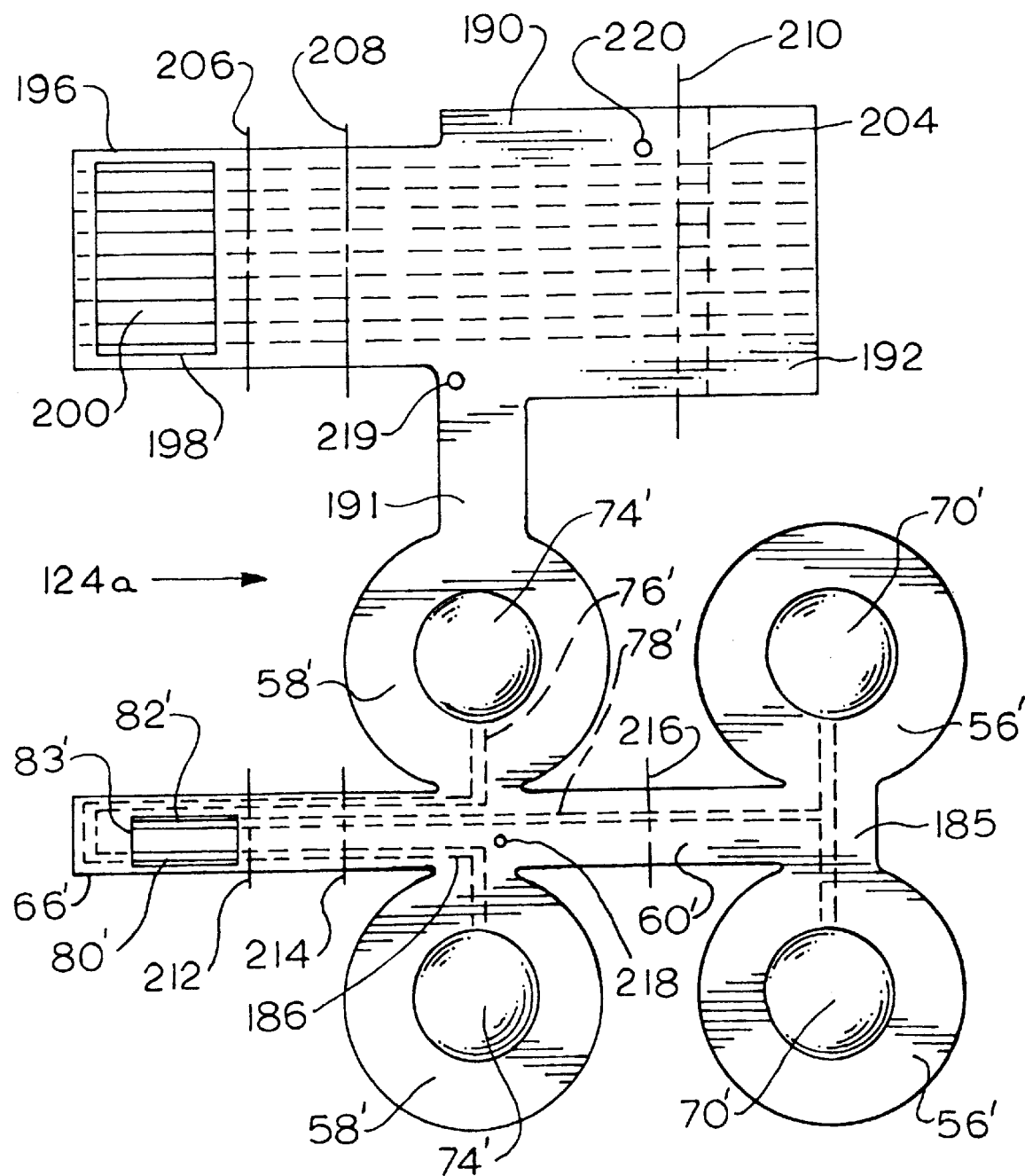
FIG. 9A is a plan view of the flexible circuit blank from which the battery connector element illustrated in FIGS. 6–8 is formed.

Referring now to FIG. 9A, there is shown a flexible circuit blank 124*a* from which the combined battery-I/O connector element 124 is formed. The conductors 80' and 82' in the battery connector section 180 of the flexible circuit are arranged to connect two batteries 24' in parallel. The conductor 182 extends through the interconnecting part 186, bent section 60' and interconnecting part 185, where it splits and runs to the dimples 70'. The other conductor 80' runs from each of the dimples 74' through the interconnecting part 186 and the connecting section 66'.

The phantom lines 206, 208, 210, 212, 214, and 216 shown in FIG. 9A indicate bend lines where the flexible circuit is bent into the configuration illustrated in FIG. 8. Circular holes 218, 219, and 220 are cut through the flexible circuit, and are arranged to receive the positioning pins 170, 172, and 174 when the connector element 124 is mounted in the base 126 of the rear connector assembly 122. The pins may be slightly higher than the thickness of the flexible circuit so the upper ends of the pins may be deformed by heat or otherwise to firmly secure the lower part of the connector element 124 in the base.

When the connector element 124 is being assembled within the cavities 131 and 134 in the base, the connecting sections 66' and 196 of the connector element are inserted through the slots 142 and 146 in the flange 138 of the base so that the exposed conductors 80', 82', and 200 of the battery and I/O connector sections of the connector element will overlie conductive traces on the circuit board 116. The conductors may be soldered to the traces, or electrically connected thereto by the use of a conductive adhesive. After the connector element 124 is fully mounted within the base 126, the cover 130 may be mounted over the I/O section of the base and secured thereto by sonic welding, adhesive, or the like.

The upper sections 56' of the dual battery connector member 180 may be raised as shown in FIG. 11, and the two batteries 24' are placed on the lower sections 58' of the connector member. The upper sections 56' are then pivoted downwardly over the batteries and the battery cover 128 is slid forwardly to apply a compressive force downwardly on the battery connector assembly in the same manner as described in connection with the embodiment illustrated in FIGS. 1–4, thereby resiliently deforming the dimples 70' and 74' to produce a firm electrical contact between the dimples and the terminals of the battery. Preferably, as seen in FIG. 10, a bevel 221 is formed at the forward inner edge of the cover 128 to facilitate movement of the cover over the battery connector assembly. As stated previously herein, the projections 164 and 166 on the forward end of the cover 128 have a frictional engagement within the slots 140 and 144 in the flange 138 so as to firmly retain the cover on the base 126.

While the connecting section 66' of the battery connector 180 is shown extending laterally outwardly from the interconnecting part 186 of the flexible circuit, it would also be possible to eliminate such connecting section, and run the conductors 80' and 82' through the interconnecting part 191, flat lower portion 190 to the connecting section 196 of the I/O connector portion of the connector element 124 so all the conductors can be connected to the conductive traces on the circuit board 116 at one position on the board.

Figure 9B:
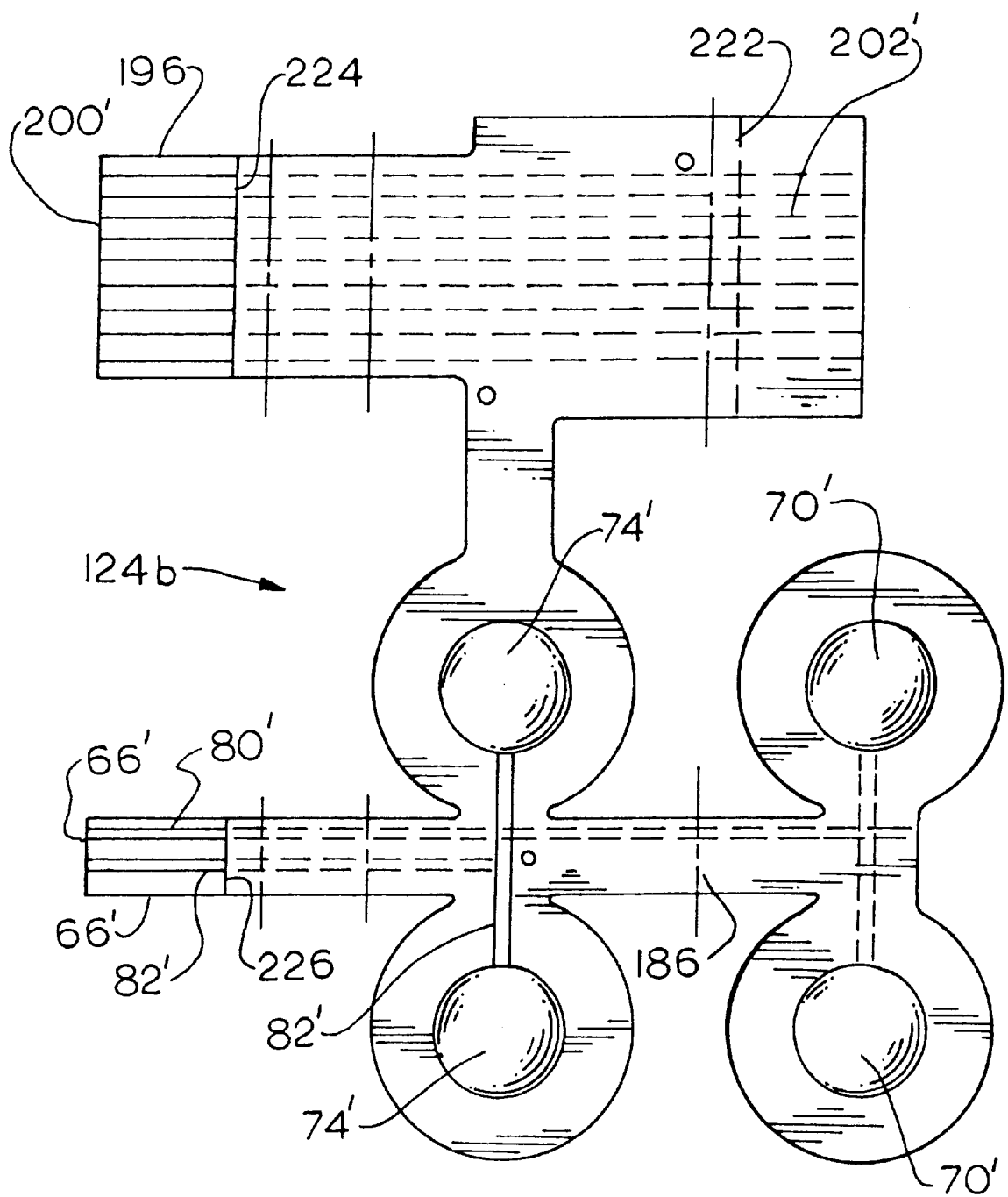
FIG. 9B is a plan view of a flexible circuit blank for forming an alternative combined battery-I/O connector element that may be used in the present invention.

Reference is now made to FIG. 9B which shows an alternative flexible circuit blank from which a modified form of the battery-I/O connector element of the invention may be formed that differs from the element 124 in that the windows 83' and 198 in the connecting sections of the connector element are eliminated, and the conductors are exposed by simply removing portions of the plastic sheets of the flexible circuit. The flexible circuit blank shown in FIG. 9B is a double conductor layer flexible circuit having two layers of conductors (metal strips) separated by an intermediate plastic sheet, and outer plastic sheets covering the upper and lower conductor layers. The conductors shown in phantom in FIG. 9B are those lying in the lower layer of conductors, while the conductors shown in full lines are in the upper layer of the conductors. The lower sheet of plastic forming the flexible circuit blank shown in FIG. 9B is cut and stripped away at strip lines 222, 224, and 226 exposing the conductors 202', 200', 80', and 82' at the connecting sections 196 and 66'. In this embodiment, an upper layer conductor 82" directly connects the dimples 74' by running through the interconnecting part 186 and the conductor 82" is electrically connected to the conductor 82' in the lower level which is exposed when the lower plastic sheet is removed at the strip line 226.

By use of the flexible circuit blank shown in FIG. 9B to form a battery-I/O connector element, the conductors 80', 82', and 200' are exposed only on the bottom of the connecting sections 196 and 66', so that such conductors would be electrically connected to the conductive traces on the circuit board 116 by an adhesive paste, rather than by soldering.

Figure 12:
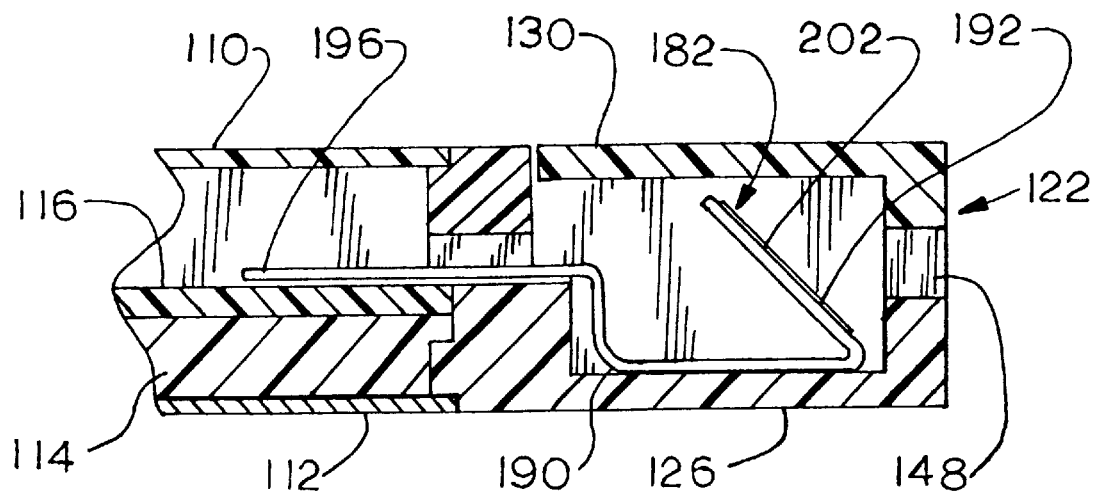
FIG. 12 is an enlarged vertical sectional view taken along line 12—12 of FIG. 7 showing the I/O connector portion of the assembly.
Figure 13:
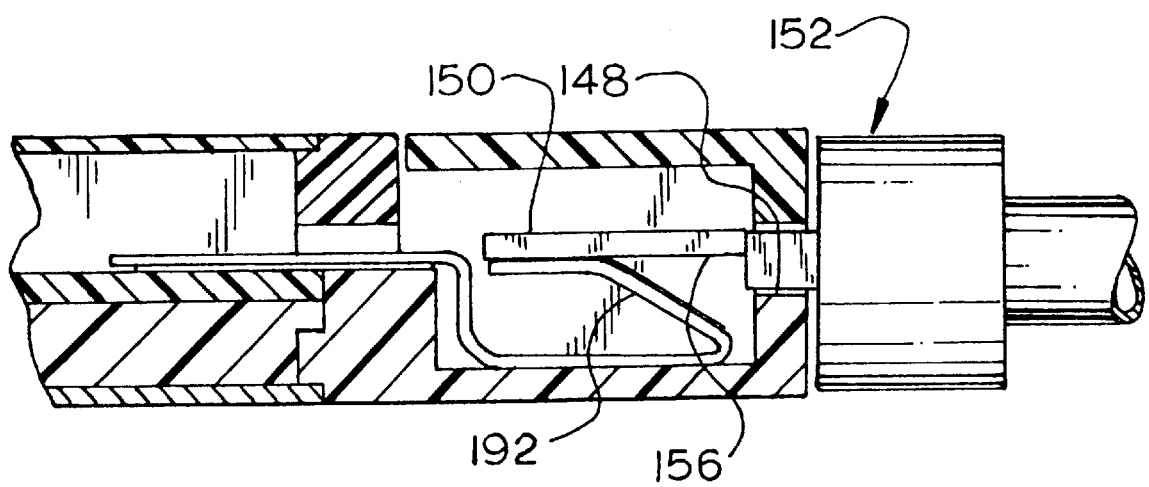
FIG. 13 is a vertical sectional view similar to FIG. 12 showing the plug connector illustrated in FIG. 7 inserted into the I/O connector portion of the assembly.

Reference is now made to FIGS. 12 and 13 that show the I/O connector member 182 mounted in the rear connector assembly 122. As seen in FIG. 12, the angular upper portion 192 of the connector member 182 is positioned in front of the slot 148 so that the conductors 202 on the upper face of the angular portion face the slot. FIG. 13 shows the plug connector 152 with its forward end 150 extending through the slot 148 to cause the angular upper portion 192 of the I/O connector member to deflect downwardly, thereby providing a resilient electrical connection between the conductive traces 156 on the bottom 150 of the plug connector and the conductors 202.

The plug connector 152 may embody a latching feature (not shown) which releasably attaches the plug connector to the rear connector assembly 122 or, alternatively, the plug connector 152 may be only temporarily inserted through the slot 148 to perform a function of programming the devices on the circuit board 116.

It will be appreciated that the embodiment of the invention disclosed in FIGS. 5–13 provides a simple, low cost, low profile connector element for making both electrical connections of two batteries in parallel to an electronic component, such as a circuit board, and electrical connection between an external connector (such as a plug connector) and the electronic component.

While terms such as "upper", "lower" and "vertical", etc, have been used herein to aid in the description of the invention, the connector element and other parts can be used in any orientation with respect to the Earth.

Although particular embodiments of the Invention have been described and illustrated herein, it is recognized that modifications and variations to the invention may readily occur to those skilled in the art and, consequently, it is intended that the claims be interpreted to cover such modifications and equivalents.

What is claimed is:

1. A battery-connector assembly comprising:

a battery having upper and lower terminals;

a connector member comprising a flexible circuit with a section bent around a side of the battery, said flexible circuit having an upper section overlaying said upper terminal, a lower section below said lower terminal, and a connecting section for making electrical connection to an electronic component;

first and second conductors on said flexible circuit, one end of one of said conductors being located at said upper section and electrically engaging said upper terminal;

one end of said second conductor being located at said lower section and electrically engaging said lower terminal;

the other ends of said first and second conductors lying at said connecting section; and one of said conductors passing through said bent section;

said battery and said upper and lower sections of said flexible circuit have a generally complementary circular configuration; and said bent section of said flexible circuit has a width less than half the diameter of said circular flexible circuit sections.

2. A battery-connector assembly as set forth in claim 1 wherein:

said bent section is curved to project beyond the space between said upper and lower sections, to allow said upper section to be raised by straightening at least part of said bent section.

3. An IC card package comprising:

an enclosure for a circuit board, said enclosure having front and rear ends;

an electrical connector at said front end of said enclosure;

a housing having a recess therein for a battery at the rear end of said enclosure, the battery having upper and lower terminals thereon;

a flexible circuit mounted in said recess having generally parallel upper and lower sections providing a space therebetween for receiving said battery, a bent section joining said parallel sections, and at least one laterally-extending connecting section for making electrical connection to conductors on said circuit board adjacent to said rear end of said enclosure;

a first conductor on said flexible circuit having a first end exposed at the lower surface of the upper parallel section for making electrical contact with the upper battery terminal and a second end exposed at said at least one connecting section for making electrical connection to a first conductor on said circuit board; and a second conductor on said flexible circuit having a first end exposed at the upper surface of the lower parallel section for making electrical contact with the lower battery terminal, and a second end exposed at said at least one connecting section for making electrical connection to a second conductor on said circuit board, with said second conductor passing through said bent section of said flexible circuit.

4. An IC card package as set forth in claim 3 wherein:

said housing has a cavity therein adjacent to said recess, and a rear wall;

a slot extending through said rear wall for receiving a plug connector therethrough having a conductor thereon;

said flexible circuit having a lateral extension thereon extending from one of said parallel sections into said cavity;

said extension having a third conductor with an exposed first end thereon adapted to be engaged by said conductor of said plug connector when said plug connector is inserted through said slot into said cavity; and said third conductor having an exposed second end at said at least one connecting section for making electrical connection to an additional conductor on said circuit board.

5. An IC card package as set forth in claim 4 wherein:

said extension is bent at an acute angle providing a lower portion and an upper angular portion; and said exposed first end of said third conductor is located on the upper surface of said upper angular portion.

6. An IC card package as set forth in claim 4 wherein:

said at least one connection section of said flexible circuit extends rearwardly from said lower portion of said extension.

7. A battery connector member for use with a circular battery comprising:

a flexible circuit having a set of generally parallel upper and lower sections providing a space therebetween for receiving a battery having upper and lower terminals thereon, a bent section joining said upper and lower sections, and a connecting section on said lower section for making electrical connection to an electronic component having first and second conductors;

a first conductor on said flexible circuit having a first end exposed at the upper surface of said lower section for making electrical contact with the lower battery terminal and a second end exposed at said connecting section for making electrical connection to the first conductor of the electronic component; and a second conductor on said flexible circuit having a first end exposed at the lower surface of said upper section for making electrical contact with the upper battery terminal, and a second end exposed at said connecting section for making electrical connection to the second conductor of the electronic component, with said second conductor passing through said bent section of said flexible circuit; wherein said upper and lower sections have a circular configuration generally corresponding to the circular shape of the battery;

said bent section has a height generally corresponding to the height of the battery; and said connecting section extends laterally from the edge of said lower section.

8. A battery connector member, comprising;

a flexible circuit having a set of generally parallel upper and lower sections providing a space therebetween for receiving a battery having upper and lower terminals thereon, a bent section joining said upper and lower sections, and a connecting section on said lower section for making electrical connection to an electronic component having first and second conductors;

a first conductor on said flexible circuit having a first end exposed at the upper surface of said lower section for making electrical contact with the lower battery terminal and a second end exposed at said connecting section for making electrical connection to the first conductor of the electronic component; and a second conductor on said flexible circuit having a first end exposed at the lower surface of said upper section for making electrical contact with the upper battery terminal, and a second end exposed at said connecting section for making electrical connection to the second conductor of the electronic component, with said second conductor passing through said bent section of said flexible circuit; wherein said first end of said first conductor is in the form an upwardly projecting resilient dimple; and said first end of said second conductor is in the form of a downwardly-projecting resilient dimple.

9. A battery connector as recited in claim 8, comprising:

means for applying a vertically-directed compressive force to said upper and lower sections of said battery connector member to resiliently deform said dimples into firm electrical engagement with the battery terminals when said battery is mounted in said space.

10. A battery connector as recited in claim 9 wherein:

said force-applying means comprises a base having a recess in which said battery connector member and the battery are mounted, and a cover overlying said base, said cover embodying means for attaching said cover to said base; and the height of said recess being less than the height of said battery connector member with the battery mounted therein when said cover is removed from said base.

11. A battery connector member, comprising:

a flexible circuit having a set of generally parallel upper and lower sections providing a space therebetween for receiving a battery having upper and lower terminals thereon, a bent section joining said upper and lower sections, and a connecting section on said lower section for making electrical connection to an electronic component having first and second conductors;

a first conductor on said flexible circuit having a first end exposed at the upper surface of said lower section for making electrical contact with the lower battery terminal and a second end exposed at said connecting section for making electrical connection to the first conductor of the electronic component; and a second conductor on said flexible circuit having a first end exposed at the lower surface of said upper section for making electrical contact with the upper battery terminal, and a second end exposed at said connecting section for making electrical connection to the second conductor of the electronic component, with said second conductor passing through said bent section of said flexible circuit; wherein said flexible circuit embodies a second set of said generally parallel upper and lower sections providing a second space therebetween for receiving a second said battery;

said flexible circuit embodies a first interconnecting part joining said upper sections of said first-mentioned and second sets;

said flexible circuit embodies a second interconnecting part joining said lower sections of said first-mentioned and second sets; and said bent section joining said first and second interconnecting parts.

12. A battery connector member as set forth in claim 11 wherein:

said first and second conductors are arranged in a pattern on said flexible circuit to electrically connect said batteries in parallel.

13. A battery connector, comprising:

a flexible circuit having a set of generally parallel upper and lower sections providing a space therebetween for receiving a battery having upper and lower terminals thereon, a bent section joining said upper and lower sections, and a connecting section on said lower section for making electrical connection to an electronic component having first and second conductors;

a first conductor on said flexible circuit having a first end exposed at the upper surface of said lower section for making electrical contact with the lower battery terminal and a second end exposed at said connecting section for making electrical connection to the first conductor of the electronic component; and a second conductor on said flexible circuit having a first end exposed at the lower surface of said upper section for making electrical contact with the upper battery terminal, and a second end exposed at said connecting section for making electrical connection to the second conductor of the electronic component, with said second conductor passing through said bent section of said flexible circuit; and wherein said flexible circuit includes an extension extending laterally from one of said parallel sections;

said extension being bent at an acute angle providing a first portion and a second angular portion; and a third conductor on said flexible circuit having a first end exposed on the upper surface of said angular portion and a second end exposed at the lower surface of said first portion, said first end of said third conductor being adapted to be contacted by conductors of an electrical connector, and said second end of said third conductor being adapted to be electrically connected to a conductor on an electronic component.

14. An electrical connector member for a battery mounted in an electrical apparatus containing an electronic component with the battery having positive and negative terminals with oppositely facing contacting surfaces, comprising a generally U-shaped flexible circuit having a set of substantially parallel sections spaced apart a distance corresponding to the distance between the contacting surfaces of the battery terminals, a bent section joining said parallel sections, and a connecting section, said parallel sections being adapted to lie adjacent to the contacting surfaces of the battery terminals when the battery is positioned between said parallel sections;

a first conductor on said flexible circuit having a first end exposed at one of said parallel sections and positioned to make electrical contact with the contacting surface of one of the battery terminals and a second end exposed at said connecting section for making electrical connection to a first conductor of the electronic component; and a second conductor on said flexible circuit having a first end exposed at the other of said parallel sections and positioned to make electrical contact with the contacting surface of the other battery terminal, and a second end exposed at said connecting section for making electrical connection to a second conductor of said electronic component, with said second conductor passing through said bent section of said flexible circuit; and wherein;

said connection section extends laterally from one of said parallel sections; and the other of said parallel sections is capable of being pivoted upwardly by bending of said bent section, for placing the battery on said one parallel section.

15. An electrical connector member for a battery mounted in an electrical apparatus containing an electronic component with the battery having positive and negative terminals with oppositely facing contacting surfaces, comprising a generally U-shaped flexible circuit having a set of substantially parallel sections spaced apart a distance corresponding to the distance between the contacting surfaces of the battery terminals, a bent section joining said parallel sections, and a connecting section, said parallel sections being adapted to lie adjacent to the contacting surfaces of the battery terminals when the battery is positioned between said parallel sections;

a first conductor on said flexible circuit having a first end exposed at one of said parallel sections and positioned to make electrical contact with the contacting surface of one of the battery terminals and a second end exposed at said connecting section for making electrical connection to a first conductor of the electronic component; and a second conductor on said flexible circuit having a first end exposed at the other of said parallel sections positioned to make electrical contact with the contacting surface of the other battery terminal, and a second end exposed at said connecting section for making electrical connection to a second conductor of said electronic component, with said second conductor passing through said bent section of said flexible circuit; and wherein:
said first end of said first conductor is in the form of a resilient dimple;
said first end of said second conductor is in the form of a resilient dimple; and
said dimples face toward each other and are resiliently deformed when a compressive force is applied to said parallel sections with the battery mounted therebetween.

16. A battery connector as recited in claim 15 wherein:
said parallel sections have a circular configuration with said dimples located substantially at the centers thereof.

17. An electrical connector member for a battery mounted in an electrical apparatus containing an electronic component with the battery having positive and negative terminals with oppositely facing contacting surfaces, comprising a generally U-shaped flexible circuit having a set of substantially parallel sections spaced apart a distance corresponding to the distance between the contacting surfaces of the battery terminals, a bent section joining said parallel sections, and a connecting section, said parallel sections being adapted to lie adjacent to the contacting surfaces of the battery terminals when the battery is positioned between said parallel sections;

a first conductor on said flexible circuit having a first end exposed at one of said parallel sections and positioned to make electrical contact with the contacting surface of one of the battery terminals and a second end exposed at said connecting section for making electrical connection to a first conductor of the electronic component; and a second conductor on said flexible circuit having a first end exposed at the other of said parallel sections positioned to make electrical contact with the contacting surface of the other battery terminal, and a second end exposed at said connecting section for making electrical connection to a second conductor of said electronic component, with said second conductor passing through said bent section of said flexible circuit; and wherein;

said flexible circuit embodies a second set of said generally parallel sections providing a second space therebetween for receiving a second battery;

said flexible circuit embodies a first interconnecting part joining said one parallel section of said first-mentioned and second sets;

said flexible circuit embodies a second interconnecting part joining said other parallel sections of said first mentioned and second sets; and said bent section joins said first and second interconnecting parts.

18. An electrical connector member as recited in claim 17 wherein: said connecting section and said bent section extend laterally from said first interconnecting part in opposite directions.

19. A battery-connector assembly, comprising:
a battery having upper and lower terminals;
a connector member comprising a flexible circuit bent around a side of the battery, said flexible circuit having an upper section overlying said upper terminal, a lower section below said lower terminal, and a connecting section for making electrical connection to an electronic component;
first and second conductors on said flexible circuit, one end of one of said conductors being located at said upper section and electrically engaging said upper terminal; and wherein
one end of said second conductor being located at said lower section and electrically engaging said lower terminal;
the other ends of said first and second conductors being exposed at said connecting section;
one of said conductors passing through said bent section;
said battery and said upper and lower sections of said flexible circuit have a generally complementary circular configuration;
said bent section of said flexible circuit has a width less than half the radius of said circular flexible circuit sections;
said connecting section of said flexible circuit extends laterally from said lower section and is generally aligned with said bent section.

20. A battery-connector assembly, comprising:
a battery having an upper and lower terminals;

a connector member comprising a flexible circuit bent around a side of the battery, said flexible circuit having an upper section overlying said upper terminal, a lower section below said lower terminal, and a connecting section for making electrical connection to an electronic component;

first and second conductors on said flexible circuit, one end of one of said conductors being located at said upper section and electrically engaging said upper terminal; and wherein one end of said second conductor being located at said lower section and electrically engaging said lower terminal;

the other ends of said first and second conductors being exposed at said connecting section;

one of said conductors passing through said bent section;

said one end of said first conductor has a downwardly-projecting resilient portion;

said one end of said second conductor has an upwardly-projecting resilient portion; and said resilient portions being in resilient engagement with said terminals of said battery.

21. A battery-connector assembly as set forth in claim 20 wherein:

said projecting resilient portions are semi-hemispherical shaped dimples.

22. A battery connector for receiving and connecting to upper and lower terminals of a battery, comprising:

a housing having spaced base and cover parts;

a flexible circuit lying between said base and cover parts of said housing, said flexible circuit having an insulative member with generally parallel upper and lower sections with a space between them for receiving said battery, and a bent section joining said upper and lower sections and bendable to enable said upper section to be pivoted up and down;

said flexible circuit including a first conductor with a first exposed surface lying at the upper surface of said lower section, and with a first conductor connecting part extending from said first exposed surface;

said flexible circuit including a second conductor with a second exposed surface lying at the lower surface of said upper section, and with a second conductor connecting part extending from said second exposed surface;

said cover part is movable between an open cover position away from said upper section to allow said sections to move apart for insertion and removal of a battery, and a closed cover position wherein said cover presses said upper and lower section toward each other to press them toward said battery terminals.

23. The battery connector described in claim 22, wherein:

of said upper and lower sections, at least one is resiliently compressible, to resiliently press a corresponding one of said exposed surfaces against a corresponding battery terminal when said cover part is moved to its closed position.

24. The battery connector described in claim 23 wherein:

said at least one of said sections has a dimple with a convex surface facing the corresponding battery terminal, with the corresponding exposed surface lying on said convex surface.

25. A method of making an electrical connection between upper and lower terminals of a battery and a pair of conductors of an electronic component comprising the steps of:

providing a flexible circuit having a connection section, and upper and lower generally parallel circuit sections joined by a bendable section, said flexible circuit having a first conductor having a first end exposed at the upper surface of said lower section and a second end exposed at said connecting section, and a second conductor on said flexible circuit having a first end exposed at the lower surface of said upper section and a second end exposed at said connection section, with said second conductor passing through said bendable section of said flexible circuit;

pivoting said upper section upwardly by a plurality of degrees;

placing said battery on said lower circuit section to make electrical contact between said first end of said first conductor and the lower terminal of said battery;

pivoting said upper section downwardly to make electrical connection between said first end of said second conductor and the upper terminal of said battery;

electrically connecting the second ends of said first and second conductors on said connecting section to the conductors of said electronic component;

providing a housing with base and cover parts wherein said base part supports said lower section and said cover part is movable between closed and open portions;

moving said cover part to said open position when pivoting said upper section upwardly and moving said cover part to said closed position when pivoting said upper section downwardly, and employing said cover part to hold down said upper section in said closed position of said cover part.

* * * * *